United States Patent
Watanabe et al.

(10) Patent No.: US 7,531,115 B2
(45) Date of Patent: May 12, 2009

(54) CONDUCTIVE MATERIAL AND METHOD FOR FILLING VIA-HOLE

(75) Inventors: Isao Watanabe, Kawasaki (JP); Kaoru Hashimoto, Kawasaki (JP); Osamu Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/074,729

(22) Filed: Mar. 9, 2005

(65) Prior Publication Data
US 2005/0147522 A1    Jul. 7, 2005

Related U.S. Application Data

(62) Division of application No. 10/348,948, filed on Jan. 23, 2003, now Pat. No. 6,886,248.

(30) Foreign Application Priority Data

Jan. 23, 2002    (JP) ............................. 2002-014470

(51) Int. Cl.
*H01B 1/02* (2006.01)
(52) U.S. Cl. .................. 252/512; 252/514; 75/228
(58) Field of Classification Search ................ 252/512, 252/514; 75/228, 247, 255
See application file for complete search history.

(56) References Cited

U.S. PATENT DOCUMENTS

| 4,544,577 | A |  | 10/1985 | May ........................... 427/97 |
|---|---|---|---|---|
| 5,029,242 | A |  | 7/1991 | Sammet ...................... 174/257 |
| 5,262,718 | A |  | 11/1993 | Svendsen et al. .......... 324/158 P |
| 5,287,620 | A |  | 2/1994 | Suzuki et al. .................. 29/852 |
| 5,370,759 | A |  | 12/1994 | Hakotani et al. ............ 156/73.1 |
| 5,565,267 | A | * | 10/1996 | Capote et al. ................ 428/344 |
| 5,630,272 | A |  | 5/1997 | Wenke ......................... 29/852 |
| 5,641,454 | A | * | 6/1997 | Kito et al. .................... 420/562 |
| 5,716,663 | A |  | 2/1998 | Capote et al. ................. 427/96 |
| 6,207,259 | B1 |  | 3/2001 | Iino et al. .................... 428/209 |
| 6,238,599 | B1 | * | 5/2001 | Gelorme et al. ............. 252/514 |
| 6,359,235 | B1 | * | 3/2002 | Hayashi ...................... 174/260 |
| 6,896,172 | B2 | * | 5/2005 | Taguchi et al. ............ 228/180.1 |
| 2002/0171157 | A1 | * | 11/2002 | Soga et al. .................. 257/783 |

FOREIGN PATENT DOCUMENTS

| JP | 58-64703 | 4/1983 |
|---|---|---|
| JP | 5-175649 | 7/1993 |
| JP | 11-298138 | 10/1999 |
| JP | 2000-183519 | 6/2000 |
| JP | 2001-44590 | 2/2001 |

* cited by examiner

*Primary Examiner*—Mark Kopec
(74) *Attorney, Agent, or Firm*—Kratz, Quintos & Hanson, LLP

(57) ABSTRACT

The conductive material comprises a first metal material having a melting point of not more than 250° C. and a second metal material having a melting point of not less than 500° C., and is paste at a temperature not more than 250° C. Whereby the conductive material can have much higher conductivity than the resin paste. The conductive material can be used in paste, whereby the conductive material can be buried in the via-hole in the same way as the resin paste.

7 Claims, 3 Drawing Sheets

CONDUCTIVE MATERIAL AND METHOD FOR FILLING VIA-HOLE

CROSS-REFERENCE TO RELATED APPLICATIONS

This application is a DIV of Ser. No. 10/348,948 (filed Jan. 23, 2003, now U.S. Pat. No. 6,886,248).

This application is based upon and claims the benefit of priority from the prior Japanese Patent Application No. 2002-014470, filed in Jan. 23, 2002, the entire contents of which are incorporated herein by reference.

BACKGROUND OF THE INVENTION

The present invention relates to a conductive material and a method for filling a via-hole, more specifically a conductive material of high conductivity which can fill micronized via-hole without generating void, and method for filling a via-hole suitable for such the conductive material.

In electronic circuit boards and semiconductor devices, conductors are buried in via-holes formed in insulating films, for connecting interconnection layers on different levels.

As methods for filling conductors in such via-holes, conventionally method for growing conductor in a via-hole by electroplating and method for filling in a via-hole a conductive resin paste containing metal powders dispersed in an organic component have been used.

However, with the recent micronization of electronic circuit boards and semiconductor devices, diameters of via-holes are so micronized that the conventional methods for filling the via-hole are insufficient to fill such via-holes.

Specifically, in the method for filling the via-hole by electroplating, as shown in FIG. 3A, usually a plated film 106 starts to grow on the sidewall and the bottom surface of the via-hole 104. At the upper end edge, where an electric field is concentrated, and a current density is higher, a growth rate is increased in this region. Accordingly, before the inside of the via-hole 104 is completely filled with the plated film 106, the upper part of the via-hole 104 is closed, leaving a void 108 at the center of the via-hole 104 (FIG. 3B). The generation of the void 108 becomes significant as the via-hole 104 has a larger aspect ratio. Resultantly, defective conduction and resistance increases often take place, and the voids are often expanded by thermal treatment to thereby break device structures.

As an improvement of this method, a method for suppressing the growth of a plated film from the sidewall of the via-hole to fill the via-hole only by the growth of the plated film from the bottom surfaces is being studied. However, this method makes no void in the via-hole, but the plating takes much time, which results in very high costs.

The filling method using the resin paste is advantageous in costs to the filling method by the plating. However, the resin paste, which is mixtures of the organic component and the metal powders, has problems of high conduction resistances, residual gas components, low usable limit temperatures, etc.

As described above, it cannot be said that the conventional methods for filling the via-hole have been sufficient to fill micronized via-holes. A technique for filling micronized via-holes with a material of high conductivity at low costs without generating voids has been required.

SUMMARY OF THE INVENTION

An object of the present invention is to provide a conductive material of high conductivity which can fill micronized via-holes at low costs without generating voids.

Another object of the present invention is to provide a method for filling a via-hole which is suitable for such the conductive material.

According to one aspect of the present invention, there is provided a conductive material comprising a first metal material having a melting point of not more than 250° C. and a second metal material having a melting point of not less than 500° C., and being paste at a temperature of not more than 250° C.

According to another aspect of the present invention, there is provided a method for filling a via-hole comprising the steps of: in an equipment having a first pressure, supplying a conductive material to a substrate with a via-hole formed in to bury the conductive material in an upper end part of the via-hole; and changing the pressure in the equipment to a second pressure which is higher than the first pressure to thereby draw the conductive material buried in the upper end part of the via-hole into the via-hole.

According to the present invention, the conductive material contains the first metal material of a melting point of not more than 250° C. melting point and the second metal material of a melting point of not less than 500° C., and is paste at a temperature of not more than 250° C., whereby the conductive material can have much higher conductivity than the resin paste. The conductive material can be used in paste, whereby the conductive material can be buried in the via-hole in the same way as the resin paste.

In an equipment having a first pressure, the conductive material is fed into a via-hole formed in a substrate to be buried in upper end part of the via-hole, the pressure in the equipment is changed a second pressure which is higher than the first pressure, whereby the conductive material buried in the upper end part of the via-hole is drawn into the via-hole to thereby fill the conductive material in the via-hole. Even micronized via-hole can be filled without generating voids.

DETAILED DESCRIPTION OF THE INVENTION

Figure 1A:
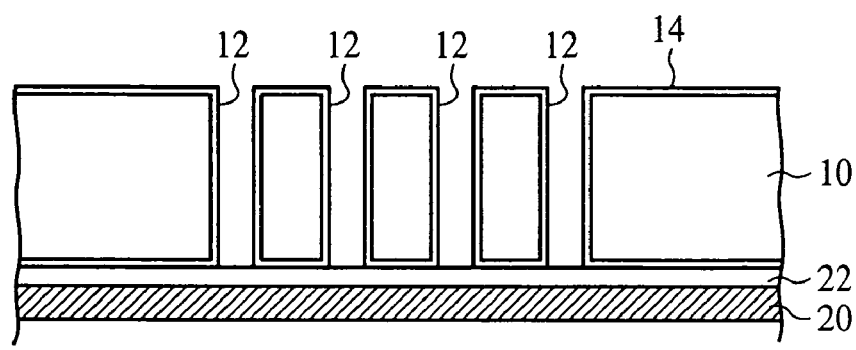
FIGS. 1A-1C and 2A-2D are sectional views explaining the method for filling the via-hole according to one embodiment of the present invention.

The conductive material according to the present invention contains a metal material A of a melting point of not more than 250° C. and a metal material B of a melting point of not less than 500° C., and is a paste at a temperature of not more than 250° C.

Here, the conductive material according to the present invention contains the metal material A of a melting point of not more than 250° C. so that the conductive material becomes paste when the conductive material is filled in the via-hole. The conductive material according to the present invention is filled in the via-hole by the method which will be described later at about 250° C. at highest. For the conductive material to be paste at this temperature, the metal material A is liquid, i.e., a melting point of the metal material A must be not more than 250° C.

Preferably a melting point of the metal A is suitably selected in accordance with a substrate temperature, etc. in a process using the conductive material. In consideration of workability it is preferable to use a metal material of a single element or an alloy material which is liquid at the room temperature to about 100° C. For example, an alloy of low melting point, such as In-76% Ga alloy, which is liquid at the room temperature, 12% Sn-18% Pb-49% Bi-21% In, whose melting point is 58° C., 16% Sn-33% Bi-51% In, whose melting point is 61° C., 47% Sn-57% Bi-26% In, whose melting point is 79° C., 22% Sn-28% Pb-50% Bi, whose melting point is 96-110° C., etc.

As the metal material A, it is preferable to use an alloy containing bismuth. The usual metal has a property of expanding the volume with temperature increases, but bismuth has a property of shrinking with temperature increase. The metal material A contains bismuth so that the volume expansion of the other metal due to temperature increase can be absorbed by bismuth, whereby the volume expansion of the conductive material as a whole can be suppressed.

The conductive material according to the present invention contains the metal material B whose melting point is not less than 500° C. so that the metal material B is dispersed in the liquid metal material A to form the paste conductive material. To this end it is necessary to disperse the metal material B in a state of powder into the metal material A.

The metal material B can be a metal which can be pulverized and does not melt at a melting point of the metal material A. For example, a single metal powder as of Cu, Ag, Zn, Ni, Fe, Pd, Au, Pt or others, an ally powder as of Au—Sn, Cu—Sn, Fe—Ni or others, or a composite metal powder as of Ag plated Cu powder, Au plated Ni powder or others can be used. The surface oxide film degrades wetting property with respect to the metal material A. It is preferable that all the metal powders are subjected to anti-oxidation treatment with fatty acid, etc.

When the melting point of the metal material B is near that of the metal material A, the metal material B melts into the metal material A to increase a melting point of the conductive material itself, which causes a risk of making difficult to fill the via-hole. From this viewpoint, it is preferable that the melting point of the metal material B is not less than 500° C.

The conductive material according to the present invention is made paste for the following reason. That is, in using the conductive material according to the present invention as a conductive material for filling the via-hole, the conductive material formed of the molten metal material A alone cannot fill micronized via-hole due to high surface tension, and even when the conductive material can be filled in the via-hole, it is difficult to retain the conductive material in the via-hole.

The metal material B is added to the metal material A and sufficiently kneaded. The surfaces of the metal material B is wetted with respect to the metal material A, the metal material A plays the role of vehicles of the conductive paste and solder paste, and the composite material becomes paste. Thus, the paste can be filled in even micronized via-hole in the same way as the resin paste. The metal material A even in the molten state is retained owing to the wetting with respect to the metal material B, thereby settling stable without flowing out after filled in the via-hole.

An addition ratio of the metal material B for making the conductive material paste varies depending on a kind and a particle size of the metal material B but is in the range of about 5-40 wt %.

On the other hand, in the resin conductive paste, the electric conduction is made by the contacts among the particles of a metal powder, and a total of resistances of the contacts is a conduction resistance of the via-hole. A value is large. On the other hand, the conductive material according to the present invention, which is paste containing the metal material B dispersed in the metal material A, becomes a single metal in via-hole, and has low conduction resistance and can have conductivity equal to that of bulk metal.

Next, the method suitable to fill the conductive material according to the present invention in the via-hole will be explained with reference to FIGS. 1A-1C and 2A-2D. FIGS. 1A-1C and 2A-2D are sectional views explaining the method for filling the via-hole according to the present embodiment.

In the following description, the conductive material according to the present invention is filled in the via-hole which are passed through a silicon substrate, but the present invention is not limited to the present embodiment.

First, the conductive material according to the present invention, containing powder of the metal material B dispersed in the metal material A is prepared. The conductive material is prepared by heating the metal material A up to above a melting point thereof, dispersing, and mixing and kneading a prescribed amount of the powder of the metal material B in the molten metal material A to thereby prepare the paste conductive material.

Then, a silicon substrate 10 with via-holes 12 for the conductive material to be filled in is mounted on a stage 10 of, e.g., a vacuum printing machine (FIG. 1A). The via-holes 12 are formed through the silicon substrate 10. A silicon oxide film 14 is formed on the surfaces of the silicon substrate including the inside walls of the via-holes 12.

A conducting layer 22 of, e.g., a 0.5 µm-thick Pt/Ti film is formed on the stage 20. The conducting layer 22 is used as an electrode.

Next, the stage 20 is heated to a temperature which is higher by 5-10° C. than a melting point of the conductive material.

Then, the conductive material 30 which has become paste by heating is set on the silicon substrate 10. The conductive material is set on the silicon substrate 10 at the edge where the via-holes 12 are not formed.

Then, the interior of the printing machine is depressurized down to a prescribed pressure.

Figure 1B:
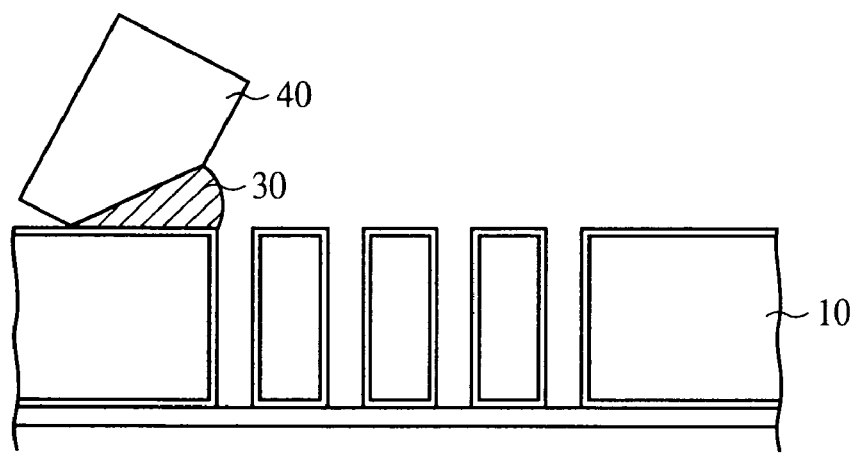
Figure 1C:
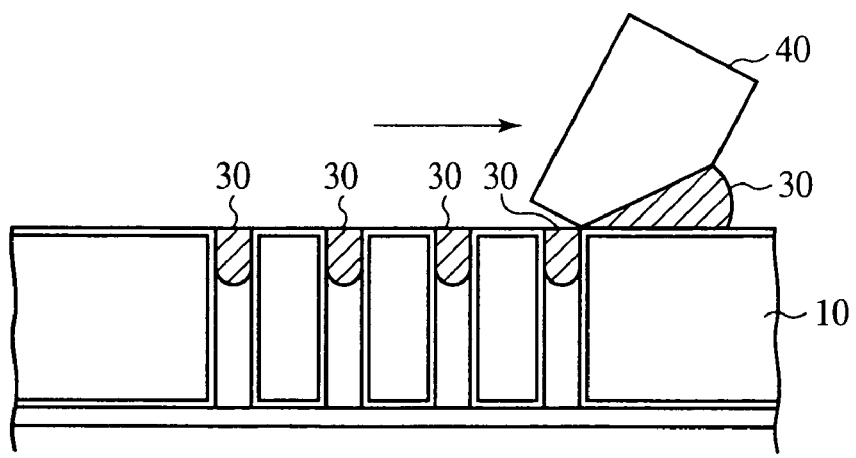

Next, the conductive material 30 is rubbed into the via-holes 12 by means of, e.g., urethane or stainless squeegee 40. Thus, the conductive material 30 is buried in the upper end part of the via-holes 12 (FIG. 1B-FIG. 1C).

Figure 2A:
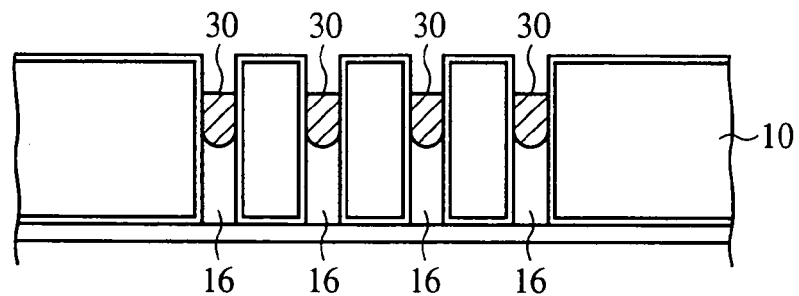
Figure 2B:
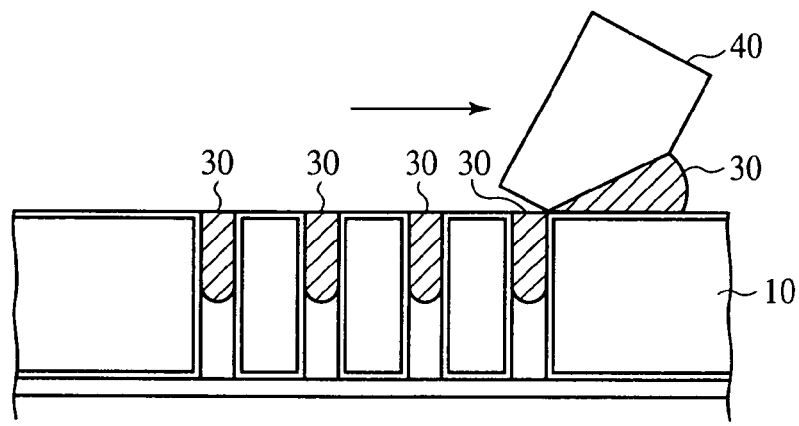
Figure 2C:
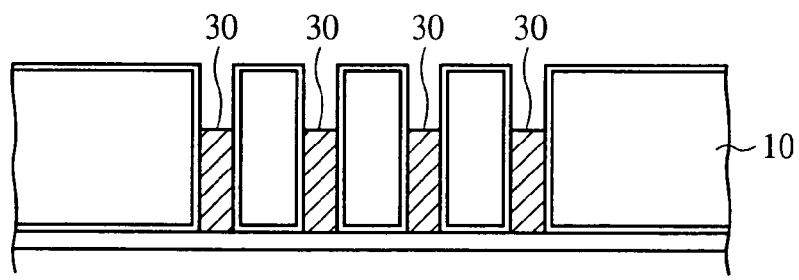

Then, the interior of the printing machine is returned to the atmospheric pressure. At this time, the voids 16 formed in the via-holes 12 on the side nearer the stage 20 have a lower pressure than the atmospheric pressure, and the conductive material 30 buried in the via-holes 12 on the side of the surfaces thereof is drawn into the via-holes 12 (FIG. 2A).

A pressure in the printing machine is made higher than an internal pressure in the printing machine at the time of burying the conductive material in the upper end part of the via-holes, whereby the conductive material can be drawn into the via-holes. Accordingly, an internal pressure of the printing machine at the time of rubbing in the conductive material is not essentially the atmospheric pressure. Similarly therewith, an internal pressure of the printing machine at the time of burying the conductive material in the upper end parts of the via-holes is not essentially a decreased pressure.

Figure 2D:
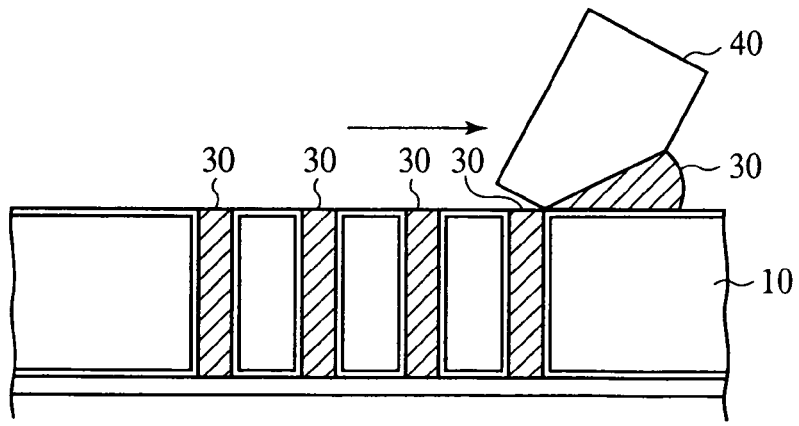
Figure 3A:
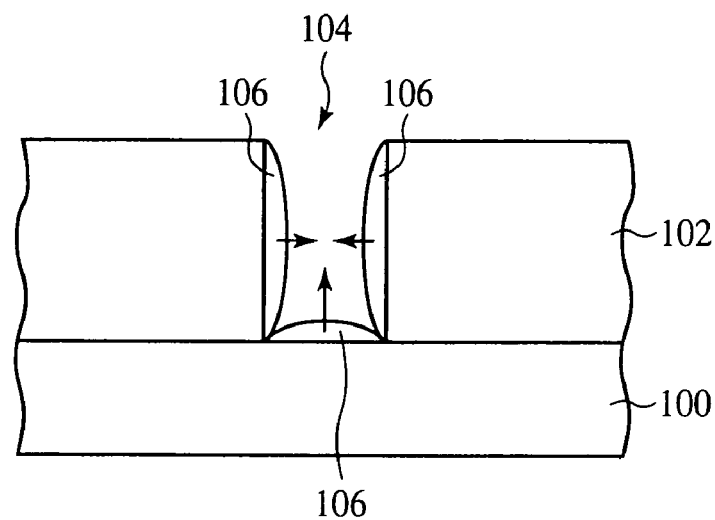
FIGS. 3A and 3B are sectional views explaining the problems of the conventional method for filling the via-hole.
Figure 3B:
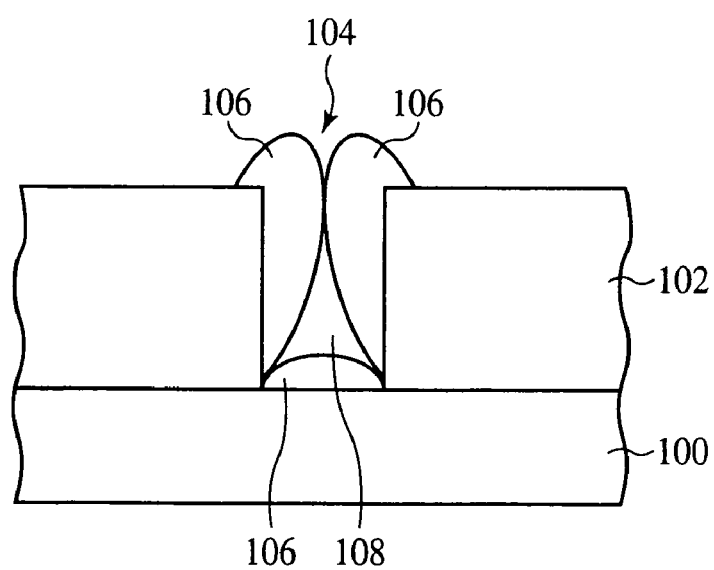

Then, in the same way as described above, the application of the conductive material 30, the depressurized processing, the squeezing (FIG. 2B), and the atmospheric pressure processing (FIG. 2C) are repeated, whereby the conductive material 30 buried in the via-holes 12 is sequentially drawn into the via-holes 12, and finally the via-holes 12 are filled with the conductive material 30 (FIG. 2D).

Next, after the conductive material 30 is buried in the via-holes 12, heat processing is performed as required. This heat processing has the effect of reacting the metal material B with the metal material A to thereby making a melting point of the conductive material high. This heat processing permits the device to be used stable at temperatures higher than an application temperature of the conductive material.

The conductive material is thus filled in the via-holes, whereby the conductive material of high conductivity can be filled in the via-holes without leaving voids.

It is possible to use, e.g., a dispenser in place of the squeegee to feed the conductive material sequentially into the respective via-holes. In this case as well, the application of the conductive material, the depressurized processing, and the atmospheric pressure processing are repeated to effectively fill the conductive material into the via-holes. In the case where the dispenser is used, the dispenser having a heating mechanism is used to thereby apply the conductive material according to the present invention in paste.

After the conductive material 30 is filled in the via-holes 12, a cap plating may be formed on the surface of the via-holes 12.

The conductive material 30 according to the present invention can be filled in the via-holes in the same way as the conventional resin conductive paste by making a temperature for the filling higher than a melting point of the conductive material.

EXAMPLE 1

16 g of Sn, 33 g of Bi and 51 g of In were loaded in a porcelain crucible, and heated and melted at a temperature of 70-80° C. Then, 10 g of 2-3 μm-diameter Cu powder was added and mixed, and the conductive material was prepared.

Then, a silicon substrate having 50 μm-diameter via-holes formed at a 150 μm-pitch and having the surface covered with a silicon oxide film is set on the stage of a vacuum printing machine.

Then, the stage of the vacuum printing machine is heated to 70° C.

Next, the conductive material heated in advance to 70° C. is set on the upper side of the substrate (the edge part where the via-holes are not formed), and the printing machine was drawn the vacuum.

Then, when a vacuum level arrived at 0.1 kPa, the conductive material was rubbed in by urethane rubber squeegee. Furthermore, the conductive material was oppositely squeezed, and then the vacuum level was returned to the atmospheric pressure at once.

Then, the drawing the vacuum was again performed, and the same operation described above was repeated twice.

The thus-prepared specimen was cleaved, and the cleavage plane was polished and observed with an SEM. The conductive material was filled down to the bottoms of the via-holes, and neither voids nor gaps were observed.

A conduction resistance of the via was measured and was 25 mΩ/via. The conduction resistance which is much lower than about 300-400 mΩ/via of the typical conduction resistance of the via using the conventional resin paste could be realized.

EXAMPLE 2

20 g of Ag-coated Cu powder of Φ6-7 μm is added to 100 g of molten metal of 18.8 wt % of Sn, 31.3 wt % of Pb and 50 wt % of Bi having a melting point of 95° C., and agitated and mixed into paste. The conductive material was thus prepared.

The conductive material was filled into the via-holes in the same way as in Example 1. In Example 2, the filling operation was made with a stainless squeegee with the stage heated to 105° C.

The thus-prepared specimen was cleaved, and the cleavage plane was polished and observed with an SEM. The conductive material was filled down to the bottoms of the via-holes, and neither voids nor gaps were observed. The conduction resistance of the via was 20 mΩ/via.

EXAMPLE 3

20 g of Cu powder of Φ5 μm is added to 100 g of molten metal of 48 wt % of Sn and 52 wt % of In having a melting point of 117° C., and agitated and mixed into paste. The conductive material was thus prepared.

The conductive material was filled into via-holes in the same way as in Example 1. In Example 2, the filling operation was made with a stainless squeegee with the stage heated to 125° C.

The thus-prepared specimen was cleaved, and the cleavage plane was polished and observed with an SEM. The conductive material was filled down to the bottoms of the via-holes, and neither voids nor gaps were observed. The conduction resistance of the via was 20 mΩ/via.

What is claimed is:

1. A conductive material consisting of:
   a main material formed of a first metal material having a melting point of not more than 250° C.; and
   a powder material formed of a second metal material having a melting point of not less than 500° C., a surface of the powder material being subjected to anti-oxidation treatment,
   the powder material being dispersed in a molten liquid of the main material so as to be a paste at a temperature of not less than a melting point of the first metal material and not more than 250° C.

2. A conductive material according to claim 1, wherein the first metal material is an alloy containing bismuth.

3. A conductive material according to claim 1, wherein
   the main material is a metal material selected from the group consisting of In-76% Ga alloy, 12% Sn-18% Pb-49% Bi-21% In alloy, 16% Sb-33% Bi-51% In alloy, 47% Sn-57% Bi-26% In alloy, and 22% Sb-28% Pb-50% Bi alloy.

4. A conductive material according to claim 1, wherein the powder material is a metal material selected from the group consisting of Cu, Ag, Zn, Ni, Fe, Pd, Au, Pt, Au—Sn alloy, Cu—Sn alloy, Fe—Ni alloy, Ag plated Cu powder, and Au plated Ni powder.

5. A conductive material according to claim 1, wherein an addition ration of the powder material to the main material is in a range of 5-40 wt %.

6. A conductive material according to claim 1, wherein the powder material is subjected to an anti-oxidation treatment with fatty acid.

7. A substrate comprising:
   a conductive material filled in a via-hole, wherein
   the conductive material consists of:
      a main material formed of a first metal material formed of an alloy containing bismuth and having a melting point of not more than 250° C., and a powder material formed of a second metal material having a melting point of not less than 500° C., a surface of the powder material being subjected to an anti-oxidation treatment; and
      the powder material is dispersed in a molten liquid of the main material so as to be a paste at a temperature of not less than a melting point of the first metal material and not more than 250° C.

* * * * *